(12) United States Patent
Terashima et al.

(10) Patent No.: US 9,320,152 B2
(45) Date of Patent: Apr. 19, 2016

(54) SOLDER BALL AND ELECTRONIC MEMBER

(71) Applicants: NIPPON STEEL & SUMIKIN MATERIALS CO., LTD., Tokyo (JP); NIPPON MICROMETAL CORPORATION, Saitama (JP)

(72) Inventors: Shinichi Terashima, Tokyo (JP); Takayuki Kobayashi, Tokyo (JP); Masamoto Tanaka, Tokyo (JP); Katsuichi Kimura, Saitama (JP); Tadayuki Sagawa, Saitama (JP)

(73) Assignees: NIPPON STEEL & SUMIKIN MATERIALS CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 14/405,691

(22) PCT Filed: May 12, 2014

(86) PCT No.: PCT/JP2014/062588
§ 371 (c)(1),
(2) Date: Dec. 4, 2014

(87) PCT Pub. No.: WO2014/192521
PCT Pub. Date: Dec. 4, 2014

(65) Prior Publication Data
US 2015/0146394 A1    May 28, 2015

(30) Foreign Application Priority Data
May 29, 2013    (JP) ................................. 2013-113421

(51) Int. Cl.
B23K 31/02    (2006.01)
H05K 3/34    (2006.01)
B23K 1/00    (2006.01)
B23K 35/26    (2006.01)
C22C 13/02    (2006.01)
C22C 13/00    (2006.01)
B23K 35/02    (2006.01)
H05K 1/18    (2006.01)

(52) U.S. Cl.
CPC ............ *H05K 3/3457* (2013.01); *B23K 1/0016* (2013.01); *B23K 35/0244* (2013.01); *B23K 35/26* (2013.01); *B23K 35/262* (2013.01); *C22C 13/00* (2013.01); *C22C 13/02* (2013.01); *H05K 1/181* (2013.01); *H05K 3/34* (2013.01); *H05K 3/3463* (2013.01); *B23K 2201/36* (2013.01); *H05K 2203/041* (2013.01)

(58) Field of Classification Search
None
See application file for complete search history.

(56) References Cited

U.S. PATENT DOCUMENTS

| | | | |
|---|---|---|---|
| 6,642,079 B1 * | 11/2003 | Liu et al. | 438/108 |
| 6,744,142 B2 * | 6/2004 | Liu et al. | 257/778 |
| 2001/0028109 A1 * | 10/2001 | Shimizu et al. | 257/737 |
| 2010/0084765 A1 * | 4/2010 | Lee et al. | 257/738 |
| 2011/0139314 A1 * | 6/2011 | Ho et al. | 148/528 |
| 2012/0161336 A1 * | 6/2012 | Lin et al. | 257/782 |
| 2014/0061287 A1 * | 3/2014 | Ohnishi et al. | 228/246 |

FOREIGN PATENT DOCUMENTS

| | | |
|---|---|---|
| JP | 2003001481 | 1/2003 |
| JP | 2004001100 | 1/2004 |
| JP | 2008521619 | 6/2008 |
| JP | 2013000744 | 1/2013 |
| WO | WO2009051255 | 4/2009 |
| WO | WO2009131114 | 10/2009 |
| WO | WO 2012/133598 A1 * | 10/2012 |
| WO | WO2012133598 | 10/2012 |

OTHER PUBLICATIONS

International Search Report dated Aug. 5, 2014 issued in corresponding PCT Application No. PCT/JP2014/062588.

* cited by examiner

*Primary Examiner* — Kiley Stoner
(74) *Attorney, Agent, or Firm* — Kenyon & Kenyon LLP

(57) ABSTRACT

A solder ball which suppresses generation of voids in a joint, excels in a thermal fatigue property, and can also obtain a good drop impact resistance property, and an electronic member using the same are provided. The solder ball is formed of a Sn—Bi type alloy containing Sn as a main element, 0.3 to 2.0 mass % of Cu, 0.01 to 0.2 mass % of Ni, and 0.1 to 3.0 mass % of Bi, and an intermetallic compound of $(Cu, Ni)_6Sn_5$ is formed in the Sn—Bi alloy so that the generation of voids in the joint when being jointed to an electrode is suppressed, a thermal fatigue property is excellent, and a good drop impact resistance property can also be obtained.

12 Claims, No Drawings

SOLDER BALL AND ELECTRONIC MEMBER

TECHNICAL FIELD

This application is a national stage application of International Application No. PCT/JP2014/062588, filed May 12, 2014, which claims priority to Japanese Patent Application No. 2013-113421, filed May 29, 2013, each of which is incorporated by reference in its entirety.

The present invention relates to a solder ball for semiconductor mounting, and an electronic member using this.

BACKGROUND ART

An electronic component is mounted on a printed circuit board or the like. In general, the mounting of the electronic component is performed by a so-called reflow method in which, after temporarily jointing the printed circuit board or the like and the electronic component with a solder ball for semiconductor mounting (hereinafter, referred to as "solder ball") and a flux, the entire printed circuit board is heated so as to melt the above-described solder ball, and then, the board is cooled to room temperature so as to solidify the solder ball, thus ensuring a solid solder-joint (also referred to as simply joint).

When operating an electronic equipment incorporating a printed circuit board or the like, heat is generated inside the electronic equipment due to a current applied for the operation. Since the above-described solder ball connects materials having different thermal expansion coefficients, such as a silicon chip and a resin substrate, with each other, the solder ball is subjected to a thermal fatigue environment with the operation of the electronic equipment. As a result, cracks may propagate inside the solder ball, and receiving/sending of an electrical signal through the solder ball may be interfered. In general, long-term reliability of the solder ball under such a thermal fatigue environment is called a thermal fatigue property or a TCT (Thermal Cycling Test) property, and is regarded as the most important property required for the solder ball.

In recent years, a lead free solder alloy used as a connecting material in an electronic apparatus has been required so as to minimize a negative impact on the environment in disposal of the electronic apparatus, but it is not general to use pure Sn as a composition of the above-described solder ball. This is because, since pure Sn is extremely soft, cracks become easy to propagate during the process of a TCT test when examining the above-described thermal fatigue property, and long-term reliability of the solder ball degrade. Accordingly, as the composition of the solder ball, in general, in addition to a Sn—Ag eutectic composition (Ag: 3.5 mass %, Sn: balance), for example, a solder composition in which a small amount of Cu as a third element is added to the chemical composition of the above-described Sn—Ag eutectic composition is widely used as disclosed in Patent Literature 1 and Patent Literature 2.

That is, by increasing the concentration of Ag, an intermetallic compound called $Ag_3Sn$ is precipitated in a large number in the solder ball, and the solder ball is hardened by precipitation hardening, and thus, deformation of the solder ball against external force becomes smaller. Conventionally, it has been considered that, by increasing the concentration of Ag, even when a load resulting from thermal fatigue is generated, a displacement itself due to the thermal fatigue becomes smaller, and thus, propagation of cracks inside the solder ball can be retarded.

However, addition of about 3 mass % is not desirable because Ag is expensive, and if about 3 mass % of Ag is added, needle-like $Ag_3Sn$ is precipitated in a large amount in Sn, when the flux used during the above-described temporary jointing is vaporized by heat during the reflow, the gas is trapped in the needle-like $Ag_3Sn$, and voids due to air bubbles are easy to be formed in the vicinity of the joint interface. In the case of a conventional solder ball with a ball size having a diameter of 180 [μm] or more, the area of a joint composed of the solder ball and an electrode was sufficiently large, and thus, even if the needle-like $Ag_3Sn$ was precipitated in the vicinity of the joint, a decrease in joint strength between the solder ball and the electrode did not become a problem, and it did not cause a negative impact on a thermal fatigue property.

However, the need for a solder ball having a diameter of less than 180 [μm] has been increased with an acceleration of miniaturizing/weight saving of recent portable electronic equipment, and in this case, the joint area of a solder-joint used in an electronic member is reduced, and therefore, suppression of voids has been more emphasized than ever before. Accordingly, a solder ball not using Ag, such as a Sn—Bi type alloy, has been proposed. Since Bi is dissolved in Sn, a needle-like precipitate such as the above-described $Ag_3Sn$ is not formed, and as a result, the above-described concern about voids is not raised even under the recent environment where the joint area is reduced.

CITATION LIST

Patent Literature

Patent Literature 1: Japanese Patent Laid-Open No. 2003-1481

Patent Literature 2: Japanese Patent Laid-Open No. 2004-1100

SUMMARY OF INVENTION

Technical Problem

However, when Bi is added to Sn, strength of the solder is improved, whereas the solder is embrittled. In a solder ball for BGA (Ball Grid Array), which has been rapidly increased in recent years, ensuring of a drop impact resistance property (hereinafter, also referred to as drop property) such that an electronic equipment does not break down even when being unexpectedly dropped is emphasized as well as the TCT property, but in the conventional solder ball formed of a Sn—Bi type alloy, there was a problem in that the TCT property is improved, whereas the drop property becomes bad.

Accordingly, the present invention has been made in view of the above-described problems, and an object thereof is to provide a solder ball which suppresses generation of voids in a joint, excels in a thermal fatigue property, and can also obtain a good drop impact resistance property, and an electronic member using this.

Solution to Problem

A solder ball according to a first aspect of the present invention is formed of a Sn—Bi type alloy containing Sn as a main element, 0.3 to 2.0 mass % of Cu, 0.01 to 0.2 mass % of Ni, and 0.1 to 3.0 mass % of Bi, in which an intermetallic compound of $(Cu, Ni)_6Sn_5$ is formed in the Sn—Bi type alloy.

A solder ball according to a second aspect of the present invention is a solder ball of the first aspect, in which a content of Ag is a detection limit or less through ICP (Inductively Coupled Plasma) analysis.

A solder ball according to a third aspect of the present invention is a solder ball of the first aspect, in which the Sn—Bi type alloy contains Ag, and a content of the Ag is 1.0 mass % or less.

A solder ball according to a fourth aspect of the present invention is a solder ball of any one of the first to third aspects, in which a ratio of the Cu to the Ni is (5 to 20):1.

A solder ball according to a fifth aspect of the present invention is a solder ball of any one of the first to fourth aspects, containing any one or two or more of Mg, Ga, and P in an amount of 0.0001 to 0.005 mass % in total.

A solder ball according to a sixth aspect of the present invention is a solder ball of any one of the first to fifth aspects, in which a content of Ge, Sb, In, P, As, Al, and Au is a detection limit or less through ICP (Inductively Coupled Plasma) analysis, or even if at least one of the Ge, Sb, In, P, As, Al, and Au is contained, any one is contained as an inevitable impurity.

A solder ball according to a seventh aspect of the present invention is a solder ball of any one of the first to sixth aspects, in which the Sn includes low α-ray Sn, and an amount of α-ray emitted is 1 [cph/cm$^2$] or less.

Moreover, an electronic member according to an eighth aspect of the present invention is an electronic member including a plurality of electronic components jointed by a joint, in which a part or all of the joint is formed by the solder ball according to any one of the first to seventh aspects.

Advantageous Effects of Invention

According to the solder ball and the electronic member of the present invention, a solder ball which suppresses generation of voids in a joint, excels in a thermal fatigue property, and can also obtain a good drop impact resistance property, and an electronic member using this can be realized.

DESCRIPTION OF EMBODIMENT

As described above, in the conventional solder ball formed of a Sn—Bi type alloy, the TCT property is improved, whereas the drop impact resistance property (drop property) deteriorates. As a result of extensive research on the reason for this by the present inventors, it became clear that this phenomenon occurs because, when the conventional solder ball formed of a Sn—Bi type alloy is mounted, between the solder ball and an electrode (for example, Cu electrode), a brittle intermetallic compound, mainly $Cu_6Sn_5$, is formed to be thick, and $Cu_6Sn_5$ or the vicinity thereof is brittle fractured by impact during a drop impact resistance property test (hereinafter, also referred to as drop property test).

Accordingly, in the present invention, it was found that, in the solder ball formed of a Sn—Bi type alloy, since a relatively ductile intermetallic compound, mainly $(Cu, Ni)_6Sn_5$, is formed to be thin between the solder ball and the electrode after the mounting, even when impact due to the drop property test is applied, the intermetallic compound or the vicinity thereof can be deformed in a ductile manner, brittle fracture becomes difficult to occur, and a high drop property can be ensured. However, if Ni is simply added to a raw material that is to be a Sn—Bi type alloy when manufacturing the solder ball, Ni in the solder ball is alloyed with Bi in the solder ball so that an intermetallic compound such as NiBi or $NiBi_3$, a solid solution in which Ni is further dissolved in a Sn—Bi solid solution and the like are formed first, and thus, Ni is consumed. Therefore, a phase formed between the solder ball and the electrode during the mounting is mainly $Cu_6Sn_5$, and the drop property cannot be improved.

Therefore, in the present invention, when manufacturing the solder ball, a method in which a solder mother alloy in which dopants are added to achieve predetermined concentrations is heated and melted in a crucible or a mold to be homogenized, and then is solidified is used, and in this case, a Cu—Ni type mother alloy was made in advance using Cu and Ni, and it was added to the raw material for a Sn—Bi type alloy and melted to be homogenized.

Cu and Ni have a property of easily alloying to each other, as is suggested by showing a complete solid solution equilibrium diagram therebetween, and it is thought that, if the Cu—Ni type mother alloy is made in advance, even when the Cu—Ni type mother alloy is added to the raw material for a Sn—Bi type alloy subsequently, it directly reacts with Sn in the Sn—Bi type alloy to easily become $(Cu, Ni)_6Sn_5$ without decomposition of the Cu—Ni type mother alloy to form an intermetallic compound with Bi or form a new solid solution with the Sn—Bi solid solution.

Accordingly, in the present invention, generation of an intermetallic compound such as NiBi or $NiBi_3$, a solid solution in which Ni is further dissolved in a Sn—Bi solid solution and the like was suppressed, and the solder ball in which the intermetallic compound of $(Cu, Ni)_6Sn_5$ is dispersed in the Sn—Bi type alloy and which excels in both the TCT property and the drop property could be manufactured.

Moreover, since the melting point of $(Cu, Ni)_6Sn_5$ is high temperature, that is, 500° C. or more, $(Cu, Ni)_6Sn_5$ does not decompose or disappear by heating in a reflow process (roughly about 250° C. at the highest) for jointing electronic components such as a printed circuit board and a semiconductor chip with the solder ball, and even after forming a joint on the electrode with the solder ball, $(Cu, Ni)_6Sn_5$ can exist in the joint. It is to be noted that the intermetallic compound of $(Cu, Ni)_6Sn_5$ is desirably formed to be in a fine particle manner and finely-dispersed in the Sn—Bi type alloy.

By mounting such a solder ball made using the Cu—Ni type mother alloy on the electrode, $(Cu, Ni)_6Sn_5$ existing in the solder ball becomes a precipitation core and the intermetallic compound formed on the electrode mainly becomes $(Cu, Ni)_6Sn_5$, and as a result, the improving effect of the TCT property by the addition of Bi and the improving effect of the drop property by $(Cu, Ni)_6Sn_5$ can be obtained at the same time. It is to be noted that observation of $(Cu, Ni)_6Sn_5$ in the solder ball can be performed by SEM (Scanning Electron Microscope), and if $(Cu, Ni)_6Sn_5$ exists such that it can be observed at about 1000 to 5000-fold magnification, the above-described effects can be obtained. Identification of $(Cu, Ni)_6Sn_5$ can be performed by electron diffraction pattern analysis by TEM (Transmission Electron Microscope).

In order to effectively obtain the intermetallic compound of $(Cu, Ni)_6Sn_5$ at the joint interface between the solder ball and the electrode, the composition in the solder ball state desirably contains Sn as a main element, 0.3 to 2.0 mass % of Cu, and 0.01 to 0.2 mass % of Ni. Less than 0.3 mass % of Cu or less than 0.01 mass % of Ni is not preferable because the Cu—Ni type mother alloy is not sufficiently produced and the $(Cu, Ni)_6Sn_5$ intermetallic compound becomes difficult to be formed at the bonded interface between the solder ball and the electrode. In contrast, more than 2.0 mass % of Cu or more than 0.2 mass % of Ni is not preferable because the solder ball becomes easy to be oxidized, and therefore, for example, the surface of the solder ball gets distorted to be a mirror ball shape, thereby causing false recognition in the mounting, or since a thick oxide film covers the surface of the solder ball, the oxide layer cannot be removed by a normal amount of the flux, and joint strength (pull strength or shear strength) between the solder ball and the electrode deteriorates.

When Bi in the Sn—Bi type alloy is set at 0.1 to 3.0 mass % in the composition in the solder ball state, the solder ball can be moderately hardened, and as a result, the TCT property becomes good. However, less than 0.1 mass % of Bi is not preferable because the remarkable effect on the TCT property cannot be obtained, and in contrast, more than 3.0 mass % of Bi is not preferable because the solder ball is hardened such that the improving effect of the drop property by $(Cu, Ni)_6Sn_5$ is negated, and both the TCT property and the drop property cannot be achieved.

In order to further improve the drop property, a method considering the feature of forming $(Cu, Ni)_6Sn_5$ as the present application is required. In the conventional solder ball that forms $Cu_6Sn_5$, since $Cu_6Sn_5$ is solid and brittle, the difference in hardness between $Cu_6Sn_5$ and a Sn mother phase becomes large, and cracks that propagate during a drop test are generated inside $Cu_6Sn_5$ or the vicinity thereof, and then, preferentially propagate inside $Cu_6Sn_5$ or the vicinity thereof. Thus, in the conventional solder ball, propagation of cracks inside the Sn mother phase is extremely rare.

In contrast, in the solder ball that forms $(Cu, Ni)_6Sn_5$ as the present application, since $(Cu, Ni)_6Sn_5$ exhibits ductility compared to $Cu_6Sn_5$, the difference in hardness between $(Cu, Ni)_6Sn_5$ and a Sn mother phase becomes small, and thus, a phenomenon that was uncommon in the past is caused, that is, cracks that propagate during a drop test are generated inside $(Cu, Ni)_6Sn_5$ or the vicinity thereof, and then, not only the cracks propagate inside $(Cu, Ni)_6Sn_5$ or the vicinity thereof but also the cracks often propagate inside the Sn mother phase.

The present inventors have found that, for the solder ball that forms $(Cu, Ni)_6Sn_5$ as the present application, it is therefore not sufficient to perform
(i) suppressing cracks generated in an intermetallic compound ($(Cu, Ni)_6Sn_5$ in the present application) and
(ii) preventing the generated cracks from propagating inside the intermetallic compound ($(Cu, Ni)_6Sn_5$ in the present application) or the vicinity thereof, which have been generally thought in the past so as to further obtain the improving effect of the drop property, and
(iii) preventing the generated cracks from propagating in the Sn mother phase also needs to be considered, and that it is important to combine these above-described three approaches (i), (ii), and (iii).

Firstly, as a method for taking a measure for the above-described (iii), making Bi to be contained in the Sn—Bi type alloy be 0.1 to 0.5 mass % is effective. This is because the concentration of Bi within this range can lower the grain boundary energy of the Sn mother phase constituting the solder ball due to optimization of the Bi concentration, and as a result, cracks can be prevented from propagating at the grain boundary of the Sn mother phase in the vicinity of $(Cu, Ni)_6Sn_5$ during the drop test, and thus, the drop property is improved. It is to be noted that this method is an effective method for the solder ball by which $(Cu, Ni)_6Sn_5$ is formed and cracks propagate also in the Sn mother phase as the present application, but in the conventional solder ball that forms $Cu_6Sn_5$, it is not an effective method because propagation of cracks inside the Sn mother phase is extremely rare.

Alternatively, as a method for taking measures for the above-described (i) and (ii), Cu and Ni to be contained in the Sn—Bi type alloy are sometimes set at 0.8 to 1.2 mass % of Cu and 0.04 to 0.15 mass % of Ni. In this case, the amount of lattice defects in $(Cu, Ni)_6Sn_5$ can be reduced, and cracks can be suppressed from propagating inside $(Cu, Ni)_6Sn_5$, and as a result, the improving effect of the drop property can be further obtained.

As a method that combines measures for the above-described (i), (ii), and (iii), there is a method in which Cu, Ni, and Bi to be contained in the Sn—Bi type alloy are contained in amounts of 0.8 to 1.2 mass % of Cu, 0.04 to 0.15 mass % of Ni, and 0.1 to 0.5 mass % of Bi. In this case, since the effect of lowering the grain boundary energy of the Sn mother phase due to optimization of the Bi concentration and the effect of reducing the amount of lattice defects in $(Cu, Ni)_6Sn_5$ can be obtained at the same time, the improving effect of the drop property can be still further obtained.

However, in the case of manufacturing a solder ball having a Bi concentration of more than 0.5 mass % so as to further improve the TCT property, in addition to performing the method that combines measures for the above-described (i) and (ii) (that is, method of adding 0.8 to 1.2 mass % of Cu and 0.04 to 0.15 mass % of Ni), the ratio of the amounts of Cu and Ni added is preferably (5 to 20):1. This is because, in such a solder ball, the amount of lattice defects in $(Cu, Ni)_6Sn_5$ can be significantly reduced, and thus, even when the Bi concentration exceeds 0.5 mass %, the improving effect of the drop property can be further obtained.

It is to be noted that, in the solder ball of the present invention, regarding Cu and Ni to be contained, when the ratio of Cu to Ni in $(Cu, Ni)_6Sn_5$ is 10:1, the amount of lattice defects in $(Cu, Ni)_6Sn_5$ is minimized, and therefore, the ratio of Cu to Ni in $(Cu, Ni)_6Sn_5$ of $(10\pm3):1$ is more preferable because the extremely-good improving effect of the drop property can be obtained. Alternatively, in the solder ball of the present invention, if the amount of Bi added can be 0.1 to 0.5 mass % even when the ratio of the amounts of Cu and Ni added is (5 to 7):1 or (13 to 20):1, the extremely-good improving effect of the drop property can be obtained by the combined effect of the above-described effects at the same level as the case where the ratio of Cu to Ni is $(10\pm3):1$.

It is to be noted that the Sn—Bi type alloy to be the solder ball contains Sn as a main element by making 95 mass % or more of Sn be contained, and predetermined amounts of Cu, Ni, and Bi are added to such a Sn—Bi type alloy containing Sn as a main element, and Mg and Ag described below are further added as necessary.

Moreover, in order to improve wettability of the solder ball, it is preferable that any one or two or more of Mg, Ga, and P be further added to the Sn—Bi type alloy in an amount of 0.0001 to 0.005 mass % in total. It is considered that this is because, since Mg, Ga, and P are metals less noble than Sn, they are preferentially oxidized than Sn, an amorphous oxide layer is formed in a rapid cooling state, and the growth of the Sn oxide on the solder ball surface is suppressed. This effect cannot be obtained when the amount of any one or two or more of Mg, Ga, and P added is less than 0.0001 mass % in total, and in contrast, more than 0.005 mass % is not preferable because Mg, Ga, and P themselves are intensively oxidized, and the solder ball becomes a multangular shape not a spherical shape. While a trace of such oxidation on the solder ball surface can be observed by a high-resolution electron microscope such as FE-SEM (Field Emission-Scanning Electron Microscope), the above-described trace of oxidation is difficult to be observed by SEM using normal $LaB_6$ or tungsten as a filament because an electron gun cannot be narrowed.

Moreover, as a result of extensive research by the present inventors, it was found that, when both Mg and Ga are added to the solder alloy that is the Sn—Bi type alloy at the same time or both Mg and P are added to the solder alloy that is the Sn—Bi type alloy at the same time, the effect of further improving the brightness of the solder ball surface can also be obtained in addition to the above-described effects. It is thought that this effect is due to the combined effect by simultaneous addition of Mg and Ga, or Mg and P, and cannot be obtained by only Mg, only Ga, or only P. Specifically, when 0.0001 mass % or more of Mg and 0.0001 mass % or more of Ga are added to the solder alloy that is the Sn—Bi type alloy within a range of 0.0002 mass % or more and 0.005 mass % or less in total, or 0.0001 mass % or more of Mg and 0.0001 mass % or more of P are added to the solder alloy that is the Sn—Bi type alloy within a range of 0.0002 mass % or more and 0.005 mass % or less in total, the brightness L* (L star) becomes 70% or more.

According to such a solder ball having high brightness L*, for example, when the solder ball is transferred onto a substrate or a device with a mounter apparatus, a risk for false recognition of the solder ball by the mounter apparatus can be reduced. It is to be noted that, as such a solder ball having high brightness L*, more preferably, when 0.0001 mass % or more of Mg and 0.0001 mass % or more of Ga are added to the solder alloy that is the Sn—Bi type alloy within a range of 0.0005 mass % or more and 0.0007 mass % or less in total, or 0.0001 mass % or more of Mg and 0.0001 mass % or more of P are added to the solder alloy that is the Sn—Bi type alloy within a range of 0.0005 mass % or more and 0.0007 mass % or less in total, the brightness L* can be 80% or more, and the above-described risk of causing false recognition of the solder ball by the mounter apparatus can be further reduced.

Furthermore, as such a solder ball having high brightness L*, most preferably, when 0.0001 mass % or more of Mg and 0.0001 mass % or more of Ga are added to the solder alloy that is the Sn—Bi type alloy within a range of 0.0008 mass % or more and 0.005 mass % or less in total, or 0.0001 mass % or more of Mg and 0.0001 mass % or more of P are added to the solder alloy that is the Sn—Bi type alloy within a range of 0.0008 mass % or more and 0.005 mass % or less in total, the brightness L* can be 85% or more, and the above-described risk of causing false recognition of the solder ball by the mounter apparatus can be further reduced. It is to be noted that the measurement of the brightness L* can be measured in accordance with JIS-Z8729.

Moreover, in the solder ball of the present invention, the content of Ag in the Sn—Bi type alloy is desirably a detection limit or less through Inductively Coupled Plasma (ICP) analysis, or even if Ag is not contained in the Sn—Bi type alloy, by making 0.1 to 3.0 mass %, preferably 0.5 to 2.0 mass % of Bi be contained, the solder ball can be hardened, and the good TCT property can be obtained, and furthermore, the improving effect of the drop property can be obtained. It is to be noted that, by making Bi to be contained in the Sn—Bi type alloy be 2.0 mass % or less, the improving effect of the drop property can be further obtained. It is to be noted that ICP analysis indicates ICP emission spectrometric analysis or ICP mass analysis, and the "detection limit or less" may be a detection limit or less through either ICP emission spectrometric analysis or ICP mass analysis.

On the other hand, in the solder ball of the present invention, Ag may be further contained with respect to the Sn—Bi type alloy, and when the content of Ag in the Sn—Bi type alloy is 1.0 mass % or less, preferably 0.1 to 1.0 mass %, the above-described $Ag_3Sn$ is precipitated in the solder ball to harden the solder ball, and the TCT property can be further improved. However, addition of more than 1.0 mass % of Ag is not preferable because the above-described voids are easy to be generated. As already described, the concentration of Bi to be added is desirably 0.1 to 0.5 mass % so as to improve the drop property, but in that case, since the amount of Bi added is low, it is difficult to ensure the TCT property. In that case, if 0.1 to 1.0 mass % of Ag is further added to the Sn—Bi type alloy, the TCT property can be ensured without impairing the drop property of the solder ball, and therefore, 0.1 to 1.0 mass % of Ag is desirably further added to the Sn—Bi type alloy in a manufacturing process.

Moreover, in the solder ball of the present invention, for example, other elements such as Ge, Sb, In, P, As, Al, and Au may be contained in the Sn—Bi type alloy containing Sn as a main element, 0.3 to 2.0 mass % of Cu, 0.01 to 0.2 mass % of Ni, and 0.1 to 3.0 mass % of Bi, as long as the intermetallic compound of $(Cu, Ni)_6Sn_5$ is formed in the Sn—Bi type alloy. However, the content of other elements such as Ge, Sb, In, P, As, Al, and Au in the Sn—Bi type alloy is desirably a detection limit or less through ICP analysis. In this case, the solder ball of the present invention can be formed by the Sn—Bi type alloy which contains 0.3 to 2.0 mass % of Cu, 0.01 to 0.2 mass % of Ni, and 0.1 to 3.0 mass % of Bi, and in which the balance is Sn or the balance is Sn and an inevitable impurity.

In particular, in the Sn—Bi type alloy, desirably, the content of Ge, Sb, In, P, As, Al, and Au is a detection limit or less through ICP analysis, or even if at least one of the Ge, Sb, In, P, As, Al, and Au is contained, any one is contained as an inevitable impurity. It is to be noted that the inevitable impurity indicates an impurity element, contamination of materials by which during manufacturing steps such as smelting and melting cannot be avoided, and which is present at 30 massppm or less in the case of, for example, Ge, Sb, In, P, As, Al, and Au. Incidentally, examples of the inevitable impurity of Sn other than them include Pb, Zn, Fe, and Cd.

In the above constitution, the solder ball is formed of the Sn—Bi type alloy containing Sn as a main element, 0.3 to 2.0 mass % of Cu, 0.01 to 0.2 mass % of Ni, and 0.1 to 3.0 mass % of Bi, and the intermetallic compound of $(Cu, Ni)_6Sn_5$ is formed in the Sn—Bi type alloy so that the generation of voids in the joint when being jointed to an electrode is suppressed, while a thermal fatigue property is excellent and a good drop impact resistance property can also be obtained.

Moreover, in the solder ball, the content of Ag is set at a detection limit or less through ICP analysis so that needle-like $Ag_3Sn$ becomes difficult to be formed, and thus, the generation of voids can be suppressed, and in contrast, even when the content of Ag is a detection limit or less through ICP analysis, a thermal fatigue property is excellent, and a good drop impact resistance property can also be obtained by the addition of Bi.

However, Ag may be contained in the Sn—Bi type alloy, and at this time, if the content of Ag is 1.0 mass % or less, preferably 0.1 to 1.0 mass %, $Ag_3Sn$ is precipitated in the solder ball, but the generation of voids can be more sufficiently suppressed than ever before, and in contrast, $Ag_3Sn$ precipitated in the solder ball hardens the solder ball, and the TCT property can be further improved.

In fact, in this solder ball, in the case where a TCT test in accordance with Examples described below is used as an indication for an evaluation of a thermal fatigue property (TCT property) when being mounted between electronic components, for example, even when the TCT test is performed by repeating 1 cycle including a series of steps of maintaining the solder ball at −40[° C.] for 30 minutes, and then, maintaining it at 125[° C.] for 30 minutes 200 times or more, an electrical resistance value becomes less than or equal to the electrical resistance value before performing the TCT test, and a good thermal fatigue property can be obtained.

Moreover, in this solder ball, in the case where a drop impact resistance property test in accordance with Examples described below is used as an indication for an evaluation of a drop impact resistance property (drop property) when being mounted between electronic components, for example, even if drop impact is applied more than 20 times when the drop impact resistance property test is performed by a test method in accordance with JESD22-b111 of JEDEC standards, an electrical resistance value becomes less than or equal to the electrical resistance value before performing the drop impact resistance property test, and a good drop impact resistance property can be obtained.

It is to be noted that a method for identifying a composition in the solder ball is not particularly limited, but for example, Energy Dispersive X-ray Spectrometry (EDS), Electron Probe Micro Analyzer (EPMA), Auger Electron Spectroscopy (AES), Secondary Ion-microprobe Mass Spectrometer (SIMS), Inductively Coupled Plasma (ICP), Glow Discharge Mass Spectrometry (GD-MASS), X-ray Fluorescence Spectrometer (XRF) and the like are preferable because they are generally proven and highly accurate.

Incidentally, in the case where the solder ball of the present invention is used for mounting on a semiconductor memory or used for mounting in the vicinity of the semiconductor memory, if α-ray is emitted from the joint formed by the solder ball, the α-ray acts on the semiconductor memory so that data may be deleted. Accordingly, in the case of considering the impact on the semiconductor memory by the α-ray, the solder ball of the present invention may be a solder ball including a solder alloy with a smaller amount of α-ray than normal, that is with a low α-ray amount, for example, the amount of α-ray is 1 [$cph/cm^2$] or less. Such a solder ball with a low α-ray amount of the present invention can be realized by manufacturing the above-described Sn—Bi type alloy using high-purity Sn with purity of 99.99% or more, which is obtained by removing impurities to be a generation source of α-ray, as a raw material.

Moreover, the shape of the solder ball of the present invention is not particularly specified, but it is industrially preferable that the ball-shaped solder alloy be transferred to the joint to be a protruding shape and the protruding object be further mounted on another electrode, because they are generally proven.

In addition to the above-described BGA, the solder ball of the present invention can also express the effect when being used as a connection terminal of a semiconductor device having a mounting configuration called CSP (Chip Scale Package) or FC (Flip Chip). In the case where the solder ball of the present embodiment is used as a connection terminal of these semiconductor devices, for example, an organic material such as a flux or a solder paste is applied on an electrode on a printed circuit board in advance, and then, the solder ball is arranged on the electrode and a solid solder-joint is formed by the above-described reflow method so that an electronic member can be obtained.

The electronic member of the present embodiment includes an electronic member in which the solder ball of the present embodiment is mounted on the BGA, CSP, or FC, or an electronic member in which an electronic member is further mounted on the printed circuit board by applying the flux or the solder paste on the electrode on the printed circuit board in advance, and then, placing the electronic member on the electrode and performing solid soldering by the above-described reflow method. Furthermore, in place of this printed circuit board, a flexible wiring tape called a TAB (Tape Automated Bonding) tape or a metal wiring called a lead frame may be used.

According to the above constitution, a manufacturing method of a solder alloy for semiconductor mounting of the present invention, which can be such a solder ball, includes a step of manufacturing a solder alloy formed of a Sn—Bi type alloy containing Sn as a main element, 0.3 to 2.0 mass % of Cu, 0.01 to 0.2 mass % of Ni, and 0.1 to 3.0 mass % of Bi, in which an intermetallic compound of $(Cu, Ni)_6Sn_5$ is formed in the Sn—Bi type alloy by preparing a Cu—Ni type mother alloy made by adding Cu and Ni, and then, adding the Cu—Ni type mother alloy to a Sn—Bi type raw material made by adding Sn and Bi, and performing heating/melting to be homogenized and solidified.

The Cu—Ni type mother alloy made in advance is made by adding Cu and Ni, and performing heating/melting to be homogenized and solidified.

Then, a manufacturing method for manufacturing a solder ball from the solder alloy includes, in addition to the above-described manufacturing step of the solder alloy, a step of manufacturing a spherical solder ball by making a wire rod from the solder alloy, and then, cutting the wire rod to be a fixed volume, and performing heating/melting to be solidified.

In a manufacturing method of a solder alloy for semiconductor mounting according to one embodiment, a solder alloy formed of a Sn—Bi type alloy is manufactured without adding Ag to either of the Cu—Ni type mother alloy and the Sn—Bi type raw material. Accordingly, by this manufacturing method of a solder alloy for semiconductor mounting, a solder alloy having a content of Ag of a detection limit or less through ICP analysis can be manufactured. In such a solder alloy for semiconductor mounting, when being used for semiconductor mounting as a solder ball, needle-like $Ag_3Sn$ becomes difficult to be formed, and thus, the generation of voids can be suppressed, and in contrast, even when the content of Ag is a detection limit or less through ICP analysis, a thermal fatigue property is excellent, and a good drop impact resistance property can also be obtained by the addition of Bi.

In contrast to the above-described one embodiment, the solder ball may be manufactured by a solder alloy containing Ag, and in this case, the manufacturing method of a solder alloy for semiconductor mounting is a step of manufacturing a solder alloy for semiconductor mounting, which is formed of a Sn—Bi type alloy having a content of Ag of 1.0 mass % or less, preferably 0.1 to 1.0 mass %, by adding Ag to at least one of the Cu—Ni type mother alloy and the Sn—Bi type raw material in the above-described step. In such a solder alloy for semiconductor mounting, when being used for semiconductor mounting as a solder ball, $Ag_3Sn$ is precipitated in the solder ball, but the generation of voids can be more sufficiently suppressed than ever before by the addition of Bi, and in contrast, $Ag_3Sn$ precipitated in the solder ball hardens the solder ball, and the TCT property can be further improved.

EXAMPLES

By varying the composition of a solder alloy to be a solder ball, a ball surface, presence or absence of generation of voids, a thermal fatigue property (TCT property), and a drop impact resistance property (drop property) of each solder ball were examined. After making a Cu—Ni type mother alloy by heating predetermined amounts of Cu and Ni to 275[° C.] in a high-frequency melting furnace to be a mother alloy in advance, the mother alloy (Cu—Ni type mother alloy) was added to a Sn—Bi type raw material which contains Sn as a main element and to which Bi and the like are added, to produce a raw material. Next, the raw material was placed in a graphite crucible and heated to 275[° C.] in the high-frequency melting furnace to be melted, and then, cooled to obtain a solder alloy for semiconductor mounting.

After that, the solder alloy was formed into a wire rod having a wire diameter of 20 [μm]. This wire rod was cut into a length of 6.83 [mm] to be a fixed volume, and then, it was heated/melted again in the high-frequency melting furnace and cooled so that a solder ball having a diameter of 160 [μm] was obtained. The composition of each of the solder balls of Examples 1 to 122 and Comparative Examples 1 to 4 was measured through ICP emission spectrometric analysis. When identification was performed by calibration curve method with plasma condition high-frequency output of 1.3 [kw] and integration time of emission intensity of 3 seconds, using a standard solution for a calibration curve of each element and a standard solution of each element, which were prepared in advance, the compositions were as shown in Tables 1 to 3 below. Inevitable impurities of the Sn raw material used in this case were Ge, Sb, In, As, Al, Au, Zn, Fe, and Cd.

Table 1 below shows Examples in which a solder alloy formed of a Sn—Bi type alloy was manufactured without adding Ag to either of the Cu—Ni type mother alloy and the Sn—Bi type raw material, and the solder ball was manufactured using the solder alloy having a content of Ag of a detection limit or less through ICP analysis.

TABLE 1

| | Composition (mass %) | | | | | | | Ratio of Cu when Ni is 1 | Oxidation of Ball Surface | L* (%) | Void | TCT Lifetime (Times) | Drop Lifetime (Times) | Presence or Absence of Formation of Intermetallic Compound Made of $(Cu,Ni)_6Sn_5$ |
|---|---|---|---|---|---|---|---|---|---|---|---|---|---|---|
| | Sn | Cu | Ni | Bi | Mg | Ga | P | Ag | | | | | | | |
| Example 1 | 97.3 | 0.3 | 0.16 | 2.2 | 0 | 0 | 0 | 0 | 1.9 | △ | △ | ◯ | ◯ | △ | ◯ |
| Example 2 | 98.9 | 0.7 | 0.03 | 0.4 | 0 | 0 | 0 | 0 | 23.3 | △ | △ | ◯ | △ | ◯ | ◯ |
| Example 3 | 98.4 | 1.3 | 0.20 | 0.1 | 0 | 0 | 0 | 0 | 6.5 | △ | △ | ◯ | △ | ◎ | ◯ |
| Example 4 | 98.6 | 0.8 | 0.04 | 0.6 | 0 | 0 | 0 | 0 | 20.0 | △ | △ | ◯ | △ | ◎ | ◯ |
| Example 5 | 98.2 | 1.0 | 0.15 | 0.7 | 0 | 0 | 0 | 0 | 6.7 | △ | △ | ◯ | △ | ◎ | ◯ |
| Example 6 | 95.8 | 1.2 | 0.04 | 3.0 | 0 | 0 | 0 | 0 | 30.0 | △ | △ | ◯ | ◯ | ◯ | ◯ |
| Example 7 | 98.6 | 0.9 | 0.04 | 0.5 | 0 | 0 | 0 | 0 | 22.5 | △ | △ | ◯ | △ | ◎ | ◯ |
| Example 8 | 99.2 | 0.4 | 0.04 | 0.4 | 0 | 0 | 0 | 0 | 10.0 | △ | △ | ◯ | △ | ◎◯ | ◯ |
| Example 9 | 98.4 | 1.2 | 0.15 | 0.3 | 0 | 0 | 0 | 0 | 8.0 | △ | △ | ◯ | △ | ◎◯ | ◯ |
| Example 10 | 96.7 | 1.2 | 0.03 | 2.0 | 0 | 0 | 0 | 0 | 40.0 | △ | △ | ◯ | ◯ | △ | ◯ |
| Example 11 | 97.3 | 0.3 | 0.16 | 2.2 | 0.0001 | 0 | 0 | 0 | 1.9 | ◯ | △ | ◯ | ◯ | △ | ◯ |
| Example 12 | 98.9 | 0.7 | 0.03 | 0.4 | 0.0005 | 0 | 0 | 0 | 23.3 | ◯ | △ | ◯ | △ | ◯ | ◯ |
| Example 13 | 98.4 | 1.3 | 0.20 | 0.1 | 0.0007 | 0 | 0 | 0 | 6.5 | ◯ | △ | ◯ | △ | ◎ | ◯ |
| Example 14 | 98.6 | 0.8 | 0.04 | 0.6 | 0.0005 | 0 | 0 | 0 | 20.0 | ◯ | △ | ◯ | △ | ◎ | ◯ |
| Example 15 | 98.1 | 1.0 | 0.15 | 0.7 | 0.0007 | 0 | 0 | 0 | 6.7 | ◯ | △ | ◯ | △ | ◎ | ◯ |
| Example 16 | 95.8 | 1.2 | 0.04 | 3.0 | 0.0010 | 0 | 0 | 0 | 30.0 | ◯ | △ | ◯ | ◯ | ◯ | ◯ |
| Example 17 | 98.6 | 0.9 | 0.04 | 0.5 | 0.0020 | 0 | 0 | 0 | 22.5 | ◯ | △ | ◯ | △ | ◎ | ◯ |
| Example 18 | 99.2 | 0.4 | 0.04 | 0.4 | 0.0030 | 0 | 0 | 0 | 10.0 | ◯ | △ | ◯ | △ | ◎◯ | ◯ |
| Example 19 | 98.3 | 1.2 | 0.15 | 0.3 | 0.0040 | 0 | 0 | 0 | 8.0 | ◯ | △ | ◯ | △ | ◎◯ | ◯ |
| Example 20 | 96.7 | 1.2 | 0.03 | 2.0 | 0.0050 | 0 | 0 | 0 | 40.0 | ◯ | △ | ◯ | ◯ | △ | ◯ |
| Example 21 | 97.3 | 0.3 | 0.16 | 2.2 | 0 | 0.0001 | 0 | 0 | 1.9 | ◯ | △ | ◯ | ◯ | △ | ◯ |
| Example 22 | 98.9 | 0.7 | 0.03 | 0.4 | 0 | 0.0005 | 0 | 0 | 23.3 | ◯ | △ | ◯ | △ | ◯ | ◯ |
| Example 23 | 98.4 | 1.3 | 0.20 | 0.1 | 0 | 0.0007 | 0 | 0 | 6.5 | ◯ | △ | ◯ | △ | ◎ | ◯ |
| Example 24 | 98.6 | 0.8 | 0.04 | 0.6 | 0 | 0.0005 | 0 | 0 | 20.0 | ◯ | △ | ◯ | △ | ◎ | ◯ |
| Example 25 | 98.1 | 1.0 | 0.15 | 0.7 | 0 | 0.0007 | 0 | 0 | 6.7 | ◯ | △ | ◯ | △ | ◎ | ◯ |
| Example 26 | 95.8 | 1.2 | 0.04 | 3.0 | 0 | 0.0010 | 0 | 0 | 30.0 | ◯ | △ | ◯ | ◯ | ◯ | ◯ |
| Example 27 | 98.6 | 0.9 | 0.04 | 0.5 | 0 | 0.0020 | 0 | 0 | 22.5 | ◯ | △ | ◯ | △ | ◎ | ◯ |
| Example 28 | 99.2 | 0.4 | 0.04 | 0.4 | 0 | 0.0030 | 0 | 0 | 10.0 | ◯ | △ | ◯ | △ | ◎◯ | ◯ |
| Example 29 | 98.3 | 1.2 | 0.15 | 0.3 | 0 | 0.0040 | 0 | 0 | 8.0 | ◯ | △ | ◯ | △ | ◎◯ | ◯ |
| Example 30 | 96.7 | 1.2 | 0.03 | 2.0 | 0 | 0.0050 | 0 | 0 | 40.0 | ◯ | △ | ◯ | ◯ | △ | ◯ |
| Example 31 | 97.3 | 0.3 | 0.16 | 2.2 | 0.0001 | 0.0001 | 0 | 0 | 1.9 | ◯ | ◯ | ◯ | ◯ | △ | ◯ |
| Example 32 | 98.9 | 0.7 | 0.03 | 0.4 | 0.0002 | 0.0002 | 0 | 0 | 23.3 | ◯ | ◯ | ◯ | △ | ◯ | ◯ |
| Example 33 | 98.4 | 1.3 | 0.20 | 0.1 | 0.0002 | 0.0003 | 0 | 0 | 6.5 | ◯ | ◎ | ◯ | △ | ◎ | ◯ |
| Example 34 | 98.6 | 0.8 | 0.04 | 0.6 | 0.0002 | 0.0002 | 0 | 0 | 20.0 | ◯ | ◎ | ◯ | △ | ◎ | ◯ |
| Example 35 | 98.1 | 1.0 | 0.15 | 0.7 | 0.0002 | 0.0003 | 0 | 0 | 6.7 | ◯ | ◎ | ◯ | △ | ◎ | ◯ |
| Example 36 | 95.8 | 1.2 | 0.04 | 3.0 | 0.0003 | 0.0003 | 0 | 0 | 30.0 | ◯ | ◎ | ◯ | ◯ | ◯ | ◯ |
| Example 37 | 98.6 | 0.9 | 0.04 | 0.5 | 0.0003 | 0.0004 | 0 | 0 | 22.5 | ◯ | ◎ | ◯ | △ | ◎ | ◯ |
| Example 38 | 99.2 | 0.4 | 0.04 | 0.4 | 0.0004 | 0.0004 | 0 | 0 | 10.0 | ◯ | ◎◯ | ◯ | △ | ◎◯ | ◯ |
| Example 39 | 98.3 | 1.2 | 0.15 | 0.3 | 0.0010 | 0.0010 | 0 | 0 | 8.0 | ◯ | ◎◯ | ◯ | △ | ◎◯ | ◯ |
| Example 40 | 96.7 | 1.2 | 0.03 | 2.0 | 0.0025 | 0.0025 | 0 | 0 | 40.0 | ◯ | ◎◯ | ◯ | ◯ | △ | ◯ |
| Example 41 | 97.3 | 0.3 | 0.16 | 2.2 | 0 | 0 | 0.0001 | 0 | 1.9 | ◯ | △ | ◯ | ◯ | △ | ◯ |
| Example 42 | 98.9 | 0.7 | 0.03 | 0.4 | 0 | 0 | 0.0005 | 0 | 23.3 | ◯ | △ | ◯ | △ | ◯ | ◯ |
| Example 43 | 98.4 | 1.3 | 0.20 | 0.1 | 0 | 0 | 0.0007 | 0 | 6.5 | ◯ | △ | ◯ | △ | ◎ | ◯ |
| Example 44 | 98.6 | 0.8 | 0.04 | 0.6 | 0 | 0 | 0.0005 | 0 | 20.0 | ◯ | △ | ◯ | △ | ◎ | ◯ |
| Example 45 | 98.1 | 1.0 | 0.15 | 0.7 | 0 | 0 | 0.0007 | 0 | 6.7 | ◯ | △ | ◯ | △ | ◎ | ◯ |
| Example 46 | 95.8 | 1.2 | 0.04 | 3.0 | 0 | 0 | 0.0010 | 0 | 30.0 | ◯ | △ | ◯ | ◯ | ◯ | ◯ |
| Example 47 | 98.6 | 0.9 | 0.04 | 0.5 | 0 | 0 | 0.0020 | 0 | 22.5 | ◯ | △ | ◯ | △ | ◎ | ◯ |
| Example 48 | 99.2 | 0.4 | 0.04 | 0.4 | 0 | 0 | 0.0030 | 0 | 10.0 | ◯ | △ | ◯ | △ | ◎◯ | ◯ |
| Example 49 | 98.3 | 1.2 | 0.15 | 0.3 | 0 | 0 | 0.0040 | 0 | 8.0 | ◯ | △ | ◯ | △ | ◎◯ | ◯ |
| Example 50 | 96.7 | 1.2 | 0.03 | 2.0 | 0 | 0 | 0.0050 | 0 | 40.0 | ◯ | △ | ◯ | ◯ | △ | ◯ |
| Example 51 | 97.3 | 0.3 | 0.16 | 2.2 | 0.0001 | 0 | 0.0001 | 0 | 1.9 | ◯ | ◯ | ◯ | ◯ | △ | ◯ |
| Example 52 | 98.9 | 0.7 | 0.03 | 0.4 | 0.0002 | 0 | 0.0002 | 0 | 23.3 | ◯ | ◯ | ◯ | △ | ◯ | ◯ |
| Example 53 | 98.4 | 1.3 | 0.20 | 0.1 | 0.0002 | 0 | 0.0003 | 0 | 6.5 | ◯ | ◎ | ◯ | △ | ◎ | ◯ |
| Example 54 | 98.6 | 0.8 | 0.04 | 0.6 | 0.0002 | 0 | 0.0002 | 0 | 20.0 | ◯ | ◯ | ◯ | △ | ◎ | ◯ |

TABLE 1-continued

| | Composition (mass %) | | | | | | | Ratio of Cu when Ni is 1 | Oxidation of Ball Surface | L* (%) | Void | TCT Lifetime (Times) | Drop Lifetime (Times) | Presence or Absence of Formation of Intermetallic Compound Made of (Cu,Ni)$_6$Sn$_5$ |
|---|---|---|---|---|---|---|---|---|---|---|---|---|---|---|
| | Sn | Cu | Ni | Bi | Mg | Ga | P | Ag | | | | | | | |
| Example 55 | 98.1 | 1.0 | 0.15 | 0.7 | 0.0002 | 0 | 0.0003 | 0 | 6.7 | ○ | ◎ | ○ | Δ | ◎ | ○ |
| Example 56 | 95.8 | 1.2 | 0.04 | 3.0 | 0.0003 | 0 | 0.0003 | 0 | 30.0 | ○ | ◎ | ○ | ○ | ○ | ○ |
| Example 57 | 98.6 | 0.9 | 0.04 | 0.5 | 0.0003 | 0 | 0.0004 | 0 | 22.5 | ○ | ◎ | ○ | Δ | ◎ | ○ |
| Example 58 | 99.2 | 0.4 | 0.04 | 0.4 | 0.0004 | 0 | 0.0004 | 0 | 10.0 | ○ | ◎○ | ○ | Δ | ◎○ | ○ |
| Example 59 | 98.3 | 1.2 | 0.15 | 0.3 | 0.0010 | 0 | 0.0010 | 0 | 8.0 | ○ | ◎○ | ○ | Δ | ◎○ | ○ |
| Example 60 | 96.7 | 1.2 | 0.03 | 2.0 | 0.0025 | 0 | 0.0025 | 0 | 40.0 | ○ | ◎○ | ○ | ○ | Δ | ○ |
| Comparative Example 1 | 99.8 | 0.1 | 0 | 0 | 0 | 0 | 0 | 0 | — | X | X | ○ | X | ○ | X |
| Comparative Example 2 | 96.5 | 0.5 | 0 | 0 | 0 | 0 | 0 | 3.0 | — | X | X | X | ○ | X | X |
| Comparative Example 3 | 93.3 | 0.5 | 0 | 4 | 0 | 0 | 0 | 2.7 | — | X | X | X | ○ | X | X |
| Comparative Example 4 | 99.3 | 0.7 | 0 | 0.0 | 0 | 0 | 0 | 0 | — | X | X | ○ | X | X | X |

Table 2 below shows Examples in which a solder alloy formed of a Sn—Bi type alloy whose content of Ag was set at 0.1 to 1.0 mass % by adding Ag to the Sn—Bi type raw material was manufactured, and the solder ball was manufactured using the solder alloy.

TABLE 2

| | Composition (mass %) | | | | | | | | Ratio of Cu when Ni is 1 | Oxidation of Ball Surface | L* (%) | Void | TCT Lifetime (Times) | Drop Lifetime (Times) | Presence or Absence of Formation of Intermetallic Compound Made of (Cu,Ni)$_6$Sn$_5$ |
|---|---|---|---|---|---|---|---|---|---|---|---|---|---|---|---|
| | Sn | Cu | Ni | Bi | Mg | Ga | P | Ag | | | | | | | |
| Example 61 | 97.2 | 0.3 | 0.16 | 2.2 | 0 | 0 | 0 | 0.1 | 1.9 | Δ | Δ | ○ | ◎ | Δ | ○ |
| Example 62 | 98.7 | 0.7 | 0.03 | 0.4 | 0 | 0 | 0 | 0.2 | 23.3 | Δ | Δ | ○ | ○ | ○ | ○ |
| Example 63 | 97.6 | 1.3 | 0.20 | 0.1 | 0 | 0 | 0 | 0.8 | 6.5 | Δ | Δ | ○ | ○ | ◎ | ○ |
| Example 64 | 98.4 | 0.8 | 0.04 | 0.6 | 0 | 0 | 0 | 0.2 | 20.0 | Δ | Δ | ○ | ○ | ◎ | ○ |
| Example 65 | 97.4 | 1.0 | 0.15 | 0.7 | 0 | 0 | 0 | 0.8 | 6.7 | Δ | Δ | ○ | ○ | ◎ | ○ |
| Example 66 | 94.8 | 1.2 | 0.04 | 3.0 | 0 | 0 | 0 | 1 | 30.0 | Δ | Δ | ○ | ◎ | ○ | ○ |
| Example 67 | 98.3 | 0.9 | 0.04 | 0.5 | 0 | 0 | 0 | 0.3 | 22.5 | Δ | Δ | ○ | ○ | ◎ | ○ |
| Example 68 | 98.7 | 0.4 | 0.04 | 0.4 | 0 | 0 | 0 | 0.5 | 10.0 | Δ | Δ | ○ | ○ | ◎○ | ○ |
| Example 69 | 97.8 | 1.2 | 0.15 | 0.3 | 0 | 0 | 0 | 0.6 | 8.0 | Δ | Δ | ○ | ○ | ◎○ | ○ |
| Example 70 | 96.0 | 1.2 | 0.03 | 2.0 | 0 | 0 | 0 | 0.7 | 40.0 | Δ | Δ | ○ | ◎ | Δ | ○ |
| Example 71 | 97.2 | 0.3 | 0.16 | 2.2 | 0.0001 | 0 | 0 | 0.1 | 1.9 | ○ | Δ | ○ | ◎ | Δ | ○ |
| Example 72 | 98.7 | 0.7 | 0.03 | 0.4 | 0.0005 | 0 | 0 | 0.2 | 23.3 | ○ | Δ | ○ | ○ | ○ | ○ |
| Example 73 | 97.6 | 1.3 | 0.20 | 0.1 | 0.0007 | 0 | 0 | 0.8 | 6.5 | ○ | Δ | ○ | ○ | ◎ | ○ |
| Example 74 | 98.4 | 0.8 | 0.04 | 0.6 | 0.0005 | 0 | 0 | 0.2 | 20.0 | ○ | Δ | ○ | ○ | ◎ | ○ |
| Example 75 | 97.3 | 1.0 | 0.15 | 0.7 | 0.0007 | 0 | 0 | 0.8 | 6.7 | ○ | Δ | ○ | ○ | ◎ | ○ |
| Example 76 | 94.8 | 1.2 | 0.04 | 3.0 | 0.0010 | 0 | 0 | 1 | 30.0 | ○ | Δ | ○ | ◎ | ○ | ○ |
| Example 77 | 98.3 | 0.9 | 0.04 | 0.5 | 0.0020 | 0 | 0 | 0.3 | 22.5 | ○ | Δ | ○ | ○ | ◎ | ○ |
| Example 78 | 98.7 | 0.4 | 0.04 | 0.4 | 0.0030 | 0 | 0 | 0.5 | 10.0 | ○ | Δ | ○ | ○ | ◎○ | ○ |
| Example 79 | 97.7 | 1.2 | 0.15 | 0.3 | 0.0040 | 0 | 0 | 0.6 | 8.0 | ○ | Δ | ○ | ○ | ◎○ | ○ |
| Example 80 | 96.0 | 1.2 | 0.03 | 2.0 | 0.0050 | 0 | 0 | 0.7 | 40.0 | ○ | Δ | ○ | ◎ | Δ | ○ |
| Example 81 | 97.2 | 0.3 | 0.16 | 2.2 | 0 | 0.0001 | 0 | 0.1 | 1.9 | Δ | Δ | ○ | ◎ | Δ | ○ |
| Example 82 | 98.7 | 0.7 | 0.03 | 0.4 | 0 | 0.0005 | 0 | 0.2 | 23.3 | Δ | Δ | ○ | ○ | ○ | ○ |
| Example 83 | 97.6 | 1.3 | 0.20 | 0.1 | 0 | 0.0007 | 0 | 0.8 | 6.5 | Δ | Δ | ○ | ○ | ◎ | ○ |
| Example 84 | 98.4 | 0.8 | 0.04 | 0.6 | 0 | 0.0005 | 0 | 0.2 | 20.0 | Δ | Δ | ○ | ○ | ◎ | ○ |
| Example 85 | 97.3 | 1.0 | 0.15 | 0.7 | 0 | 0.0007 | 0 | 0.8 | 6.7 | Δ | Δ | ○ | ○ | ◎ | ○ |
| Example 86 | 94.8 | 1.2 | 0.04 | 3.0 | 0 | 0.0010 | 0 | 1 | 30.0 | Δ | Δ | ○ | ◎ | ○ | ○ |
| Example 87 | 98.3 | 0.9 | 0.04 | 0.5 | 0 | 0.0020 | 0 | 0.3 | 22.5 | Δ | Δ | ○ | ○ | ◎ | ○ |
| Example 88 | 98.7 | 0.4 | 0.04 | 0.4 | 0 | 0.0030 | 0 | 0.5 | 10.0 | Δ | Δ | ○ | ○ | ◎○ | ○ |
| Example 89 | 97.7 | 1.2 | 0.15 | 0.3 | 0 | 0.0040 | 0 | 0.6 | 8.0 | Δ | Δ | ○ | ○ | ◎○ | ○ |
| Example 90 | 96.0 | 1.2 | 0.03 | 2.0 | 0 | 0.0050 | 0 | 0.7 | 40.0 | Δ | Δ | ○ | ◎ | Δ | ○ |
| Example 91 | 97.2 | 0.3 | 0.16 | 2.2 | 0.0001 | 0.0001 | 0 | 0.1 | 1.9 | ○ | ○ | ○ | ◎ | Δ | ○ |
| Example 92 | 98.7 | 0.7 | 0.03 | 0.4 | 0.0002 | 0.0002 | 0 | 0.2 | 23.3 | ○ | ◎ | ○ | ○ | ○ | ○ |
| Example 93 | 97.6 | 1.3 | 0.20 | 0.1 | 0.0002 | 0.0003 | 0 | 0.8 | 6.5 | ○ | ◎ | ○ | ○ | ◎ | ○ |
| Example 94 | 98.4 | 0.8 | 0.04 | 0.6 | 0.0002 | 0.0002 | 0 | 0.2 | 20.0 | ○ | ◎ | ○ | ○ | ◎ | ○ |
| Example 95 | 97.3 | 1.0 | 0.15 | 0.7 | 0.0002 | 0.0003 | 0 | 0.8 | 6.7 | ○ | ◎ | ○ | ○ | ◎ | ○ |
| Example 96 | 94.8 | 1.2 | 0.04 | 3.0 | 0.0003 | 0.0003 | 0 | 1 | 30.0 | ○ | ◎ | ○ | ◎ | ○ | ○ |

TABLE 2-continued

| | Composition (mass %) | | | | | | | Ratio of Cu when Ni is 1 | Oxidation of Ball Surface | L* (%) | Void | TCT Lifetime (Times) | Drop Lifetime (Times) | Presence or Absence of Formation of Intermetallic Compound Made of (Cu,Ni)$_6$Sn$_5$ |
|---|---|---|---|---|---|---|---|---|---|---|---|---|---|---|
| | Sn | Cu | Ni | Bi | Mg | Ga | P | Ag | | | | | | | |
| Example 97 | 98.3 | 0.9 | 0.04 | 0.5 | 0.0003 | 0.0004 | 0 | 0.3 | 22.5 | ○ | ⊙ | ○ | ○ | ⊙ | ○ |
| Example 98 | 98.7 | 0.4 | 0.04 | 0.4 | 0.0004 | 0.0004 | 0 | 0.5 | 10.0 | ○ | ⊙○ | ○ | ○ | ⊙○ | ○ |
| Example 99 | 97.7 | 1.2 | 0.15 | 0.3 | 0.0010 | 0.0010 | 0 | 0.6 | 8.0 | ○ | ⊙○ | ○ | ○ | ⊙○ | ○ |
| Example 100 | 96.0 | 1.2 | 0.03 | 2.0 | 0.0025 | 0.0025 | 0 | 0.7 | 40.0 | ○ | ⊙○ | ○ | ⊙ | Δ | ○ |
| Example 101 | 97.2 | 0.3 | 0.16 | 2.2 | 0 | 0 | 0.0001 | 0.1 | 1.9 | Δ | Δ | ○ | ⊙ | Δ | ○ |
| Example 102 | 98.7 | 0.7 | 0.03 | 0.4 | 0 | 0 | 0.0005 | 0.2 | 23.3 | Δ | Δ | ○ | ○ | ○ | ○ |
| Example 103 | 97.6 | 1.3 | 0.20 | 0.1 | 0 | 0 | 0.0007 | 0.8 | 6.5 | Δ | Δ | ○ | ○ | ⊙ | ○ |
| Example 104 | 98.4 | 0.8 | 0.04 | 0.6 | 0 | 0 | 0.0005 | 0.2 | 20.0 | Δ | Δ | ○ | ○ | ⊙ | ○ |
| Example 105 | 97.3 | 1.0 | 0.15 | 0.7 | 0 | 0 | 0.0007 | 0.8 | 6.7 | Δ | Δ | ○ | ○ | ⊙ | ○ |
| Example 106 | 94.8 | 1.2 | 0.04 | 3.0 | 0 | 0 | 0.0010 | 1 | 30.0 | Δ | Δ | ○ | ⊙ | ○ | ○ |
| Example 107 | 98.3 | 0.9 | 0.04 | 0.5 | 0 | 0 | 0.0020 | 0.3 | 22.5 | Δ | Δ | ○ | ○ | ⊙ | ○ |
| Example 108 | 98.7 | 0.4 | 0.04 | 0.4 | 0 | 0 | 0.0030 | 0.5 | 10.0 | Δ | Δ | ○ | ○ | ⊙○ | ○ |
| Example 109 | 97.7 | 1.2 | 0.15 | 0.3 | 0 | 0 | 0.0040 | 0.6 | 8.0 | Δ | Δ | ○ | ○ | ⊙○ | ○ |
| Example 110 | 96.0 | 1.2 | 0.03 | 2.0 | 0 | 0 | 0.0050 | 0.7 | 40.0 | Δ | Δ | ○ | ⊙ | Δ | ○ |
| Example 111 | 97.2 | 0.3 | 0.16 | 2.2 | 0.0001 | 0 | 0.0001 | 0.1 | 1.9 | ○ | ○ | ○ | ⊙ | Δ | ○ |
| Example 112 | 98.7 | 0.7 | 0.03 | 0.4 | 0.0002 | 0 | 0.0002 | 0.2 | 23.3 | ○ | ○ | ○ | ○ | ○ | ○ |
| Example 113 | 97.6 | 1.3 | 0.20 | 0.1 | 0.0002 | 0 | 0.0003 | 0.8 | 6.5 | ○ | ⊙ | ○ | ○ | ⊙ | ○ |
| Example 114 | 98.4 | 0.8 | 0.04 | 0.6 | 0.0002 | 0 | 0.0002 | 0.2 | 20.0 | ○ | ○ | ○ | ○ | ⊙ | ○ |
| Example 115 | 97.3 | 1.0 | 0.15 | 0.7 | 0.0002 | 0 | 0.0003 | 0.8 | 6.7 | ○ | ⊙ | ○ | ○ | ⊙ | ○ |
| Example 116 | 94.8 | 1.2 | 0.04 | 3.0 | 0.0003 | 0 | 0.0003 | 1 | 30.0 | ○ | ⊙ | ○ | ⊙ | ○ | ○ |
| Example 117 | 98.3 | 0.9 | 0.04 | 0.5 | 0.0003 | 0 | 0.0004 | 0.3 | 22.5 | ○ | ⊙ | ○ | ○ | ⊙ | ○ |
| Example 118 | 98.7 | 0.4 | 0.04 | 0.4 | 0.0004 | 0 | 0.0004 | 0.5 | 10.0 | ○ | ⊙○ | ○ | ○ | ⊙○ | ○ |
| Example 119 | 97.7 | 1.2 | 0.15 | 0.3 | 0.0010 | 0 | 0.0010 | 0.6 | 8.0 | ○ | ⊙○ | ○ | ○ | ⊙○ | ○ |
| Example 120 | 96.0 | 1.2 | 0.03 | 2.0 | 0.0025 | 0 | 0.0025 | 0.7 | 40.0 | ○ | ⊙○ | ○ | ⊙ | Δ | ○ |

It is to be noted that a commercial raw material whose amount of α-ray is not particularly reduced was used as Sn used for the solder alloys in Table 1 and Table 2. On the other hand, in Example 121 and Example 122 in Table 3, for comparison, high-purity Sn with purity of 99.99% was used as a raw material, and a solder ball with low α-ray, the amount of α-ray of 1 [cph/cm$^2$] or less, was made. Moreover, the amount of α-ray of the solder ball was counted by a commercial α-ray measuring instrument for semiconductor, and the result thereof was shown in the column "Amount of α-ray Generated" in Table 3.

Surface" was "○" or "Δ." In particular, in the solder ball to which Mg, Ga, and P were added in an amount of 0.0001 to 0.005 mass % in total, "Oxidation of Ball Surface" was "○," and a good result could be obtained.

Moreover, the brightness L* of the solder ball surface was measured using a commercial spectrophotometer. A white light source was used as a light source, three test pieces each of which was obtained by filling a circular cylinder tube having a diameter of 3 [mm] with the solder ball were prepared, the brightness L* when measuring the center part thereof was determined in accordance with JIS-Z8729, and

TABLE 3

| | Composition (mass %) | | | | | | | Ratio of Cu When Ni is 1 | Amount of α-ray Generated (cph/cm$^2$) | Oxidation of Ball surface | L* (%) | Void | TCT Lifetime (Times) | Drop Lifetime (Times) | Presence or Absence of Formation of Intermetallic Compound Made of (Cu,Ni)$_6$Sn$_5$ |
|---|---|---|---|---|---|---|---|---|---|---|---|---|---|---|---|
| | Sn | Cu | Ni | Bi | Mg | Ga | P | Ag | | | | | | | |
| Example 121 | 99.2 | 0.4 | 0.04 | 0.4 | 0 | 0 | 0 | 0 | 10.0 | 0.9 | ○ | Δ | ○ | ○ | ⊙○ | ○ |
| Example 122 | 98.7 | 0.4 | 0.04 | 0.4 | 0 | 0 | 0 | 0.5 | 10.0 | 0.9 | ○ | Δ | ○ | ○ | ⊙○ | ○ |

The degree of oxidation on the solder ball surface was observed at 70000-fold magnification using FE-SEM and EDX. In so doing, regarding the examination of each of Examples 1 to 60 and Comparative Examples 1 to 4 in Table 1, Examples 61 to 120 in Table 2, and Examples 121 and 122 in Table 3, "X" when the solder ball surface was deformed into a multangular shape, "Δ" when such a deformation was observed only a little, and "○" when such a deformation was not observed at all are shown in the column "Oxidation of Ball Surface" in Tables 1 to 3. As a result, regarding all of Examples 1 to 60 in Table 1, Examples 61 to 120 in Table 2, and Examples 121 and 122 in Table 3, "Oxidation of Ball the average value thereof was used as the brightness L* of the present examples. "X" when the brightness L* was less than 60%, "Δ" when it was 60% or more and less than 70%, "○" when it was 70% or more and less than 80%, "⊙" when it was 80% or more and less than 85%, and "⊙○" when it was 85% or more are respectively shown in Tables 1 to 3.

According to Table 1 to Table 3, it could be confirmed that, in the solder ball to which both Mg and Ga were added and the solder ball to which Mg and P were added, the brightness was improved compared to the solder ball to which a simple substance of Mg, a simple substance of Ga, or a simple substance of P was added.

Next, whether or not the intermetallic compound of $(Cu, Ni)_6Sn_5$ was formed in the Sn—Bi type alloy constituting the solder ball was examined. Firstly, the intermetallic compound was observed at 5000-fold magnification by FE-SEM in three viewing fields, and then, a typical diffraction pattern of the intermetallic compound was obtained from an electron diffraction pattern by TEM, and the crystal structure thereof was identified. When it was identified as $(Cu, Ni)_6Sn_5$, the intermetallic compound having the same contrast as observed by SEM was regarded as $(Cu, Ni)_6Sn_5$. In Table 1 to Table 3, "○" is shown in the column "Presence or Absence of Formation of Intermetallic Compound Made of $(Cu, Ni)_6Sn_5$" when $(Cu, Ni)_6Sn_5$ was observed in the above-described SEM observation, and "X" is shown when it was not observed. The sample for SEM was obtained by performing mechanical polishing, and the accelerating voltage during the SEM observation was 20 [kV].

Furthermore, the size of the identified intermetallic compound of $(Cu, Ni)_6Sn_5$ was also examined. The identification of the size of the intermetallic compound was performed by taking an SEM image and measuring the diameters of the particulate intermetallic compounds, and the average particle diameter of these 10 intermetallic compounds was used as the size of the intermetallic compound. The thin-film sample for TEM was obtained by performing a cutting processing by FIB (Focused Ion Beam), and the accelerating voltage during the TEM observation was 100 [kV]. As a result, it could be confirmed that, in all of Examples 1 to 60 in Table 1, Examples 61 to 120 in Table 2, and Examples 121 and 122 in Table 3, the intermetallic compound of $(Cu, Ni)_6Sn_5$ was formed with one having a submicron size smaller than 1 [μm] as a main element at both positions of inside a Sn crystal grain and on a Sn crystal grain boundary. In contrast, in Comparative Examples 1 to 4 in Table 1, the intermetallic compound of $(Cu, Ni)_6Sn_5$ was not observed. Moreover, it could be confirmed that, in the Sn—Bi type alloy of each of the solder balls of Examples 1 to 60 in Table 1, Examples 61 to 120 in Table 2, and Examples 121 and 122 in Table 3, formation of an intermetallic compound of NiBi or $NiBi_3$ and a solid solution in which Ni was further dissolved in a Sn—Bi solid solution was suppressed.

Next, regarding each of the solder balls of Examples 1 to 60 in Table 1, Examples 61 to 120 in Table 2, Examples 121 and 122 in Table 3, and Comparative Examples 1 to 4 in Table 1, presence or absence of void generation, a thermal fatigue property, and a drop impact resistance property were examined. As a printed board on which the solder ball is mounted, a printed board in which a size is 40 [mm]×30 [mm]×1 [mm], an electrode has a pitch of 0.27 [mm], and the electrode surface maintains a Cu electrode was used. After applying a water-soluble flux onto the printed board, the solder ball was mounted thereon, and it was heated in a reflow furnace with the peak temperature kept at 250[° C.] and cooled so that a solder bump was formed on the printed board.

Furthermore, a semiconductor device was jointed onto the solder bump in the same method (after applying a water-soluble flux onto an electrode on the semiconductor device, the electrode was positioned on the solder bump on the printed board, and it was heated in the reflow furnace with the peak temperature kept at 250[° C.] and cooled so that the solder bump was jointed to the semiconductor device), and an electronic member having a constitution of the printed board (electronic component)/the solder bump (joint)/the semiconductor device (electronic component) was obtained. It is to be noted that the semiconductor device was 8 [mm] square and had 324 pins, and the electrode was Cu.

In observation of voids with respect to each of the electronic members in which the compositions of the solder balls were varied, when 100 bumps were observed by an X-ray transmission observer, the case where a void having a diameter of more than one-fifth of the bump diameter was observed was defective and indicated by "X," and the case where it was not observed was indicated by "○." As a result, the result shown in the column "Void" in Tables 1 to 3 was obtained. In each of the solder balls of Examples 1 to 60 in Table 1, Examples 61 to 120 in Table 2, and Examples 121 and 122 in Table 3, the evaluation of "Void" was "○."

Next, a TCT test was performed with respect to the above-described electronic member made using each of the solder balls of Examples 1 to 60 in Table 1, Examples 61 to 120 in Table 2, Examples 121 and 122 in Table 3, and Comparative Examples 1 to 4 in Table 1, and evaluation of a thermal fatigue property was performed for each electronic member. The TCT test was performed by repeating 1 cycle including a series of steps of maintaining at −40[° C.] for 30 minutes, and then, maintaining at 125[° C.] for 30 minutes, predetermined times. Then, a test piece (electronic member) was taken out from a TCT test apparatus every time, this 1 cycle was performed 25 times, and a continuity test for measuring the value of electrical resistance including that of the joint between the printed board and the semiconductor device by the resistance value between terminals that were wire-connected on the printed board in advance was performed. In the continuity test, the case where the electrical resistance value of the electronic member exceeded 2 [Ω] that is the initial value before performing the TCT test was regarded as generation of a defect, and the result thereof was shown in the column "TCT Lifetime" in Table 1 to Table 3.

In the column "TCT Lifetime" in Tables 1 to 3, the case where the number of times when a defect was generated first was 200 times or less was defective and is indicated by "X," the case where it was more than 200 times and 350 times or less was a practically usable level and is indicated by "Δ," the case where it was more than 350 times and 450 times or less was good and is indicated by "○," and the case where it was more than 450 times was extremely good and indicated by "⊙." As a result, it could be confirmed that, even in the solder balls of Examples 1 to 60 in Table 1, to which Ag was not added (that is, the solder balls having a content of Ag of a detection limit or less through ICP analysis), the TCT property became good to the practically usable level or more by adding a predetermined amount of Bi.

Next, a drop impact resistance property test was performed with respect to the above-described electronic member made using each of the solder balls of Examples 1 to 60 in Table 1, Examples 61 to 120 in Table 2, Examples 121 and 122 in Table 3, and Comparative Examples 1 to 4 in Table 1, and evaluation of a drop impact resistance property was performed for each electronic member. Specifically, the evaluation of a drop impact resistance property was evaluated using an impact wave that applies an acceleration of 1500 [G] for 0.5 [ms] as a test method in accordance with JESD22-b111 of JEDEC (Solid State Technology Association) standards. In so doing, the continuity in the joint between the printed board and the semiconductor device of a test piece (electronic member) was confirmed every drop by a continuity test. Then, the value of electrical resistance including that of the joint between the printed board and the semiconductor device in the electronic member was measured by the resistance value between terminals that were wire-connected on the printed board in advance, and the case where it exceeded 2 [Ω] that is the initial value before performing the drop impact resistance property test was regarded as generation of a defect (fracture).

In the column "Drop Lifetime" in Tables 1 to 3, the case where the number of times when a defect was generated first was 20 times or less was defective and is indicated by "X," the case where it was more than 20 times and 40 times or less was a practically usable level and is indicated by "Δ," the case where it was more than 40 times and 70 times or less was good and is indicated by "○," the case where it was more than 70 times and less than 90 times was extremely good and is indicated by "◉," and the case where it was 90 times or more was the best and is indicated by "◉○." As a result, it could be confirmed that the drop impact resistance property became good to the practically usable level or more by adding 0.1 to 3.0 mass % of Bi to the Sn—Bi type alloy. In particular, it could be confirmed that a better drop impact resistance property was obtained by making 0.5 to 2.0 mass % of Bi be contained in the Sn—Bi type alloy.

Accordingly, it could be confirmed that, in a solder ball formed of a Sn—Bi type alloy containing Sn as a main element, 0.3 to 2.0 mass % of Cu, 0.01 to 0.2 mass % of Ni, 0.1 to 3.0 mass % of Bi, and 0 to 1.0 mass % of Ag, in which an intermetallic compound of $(Cu, Ni)_6Sn_5$ was formed in the Sn—Bi alloy, generation of voids in a joint when being jointed to an electrode was suppressed, while a thermal fatigue property was excellent, and a good drop impact resistance property could also be obtained.

Moreover, regarding Cu and Ni, as shown in Tables 1 to 3, when the ratio of the amounts of Cu and Ni added was (5 to 20):1 or when the concentration of Bi was 0.1 to 0.5 mass %, the drop property could be "○" or more, and good results could be obtained for both the TCT property and the drop property. In particular, it could be confirmed that, when the ratio of the amounts of Cu and Ni added was around 10:1, the improving effect of the TCT property was obtained, while the good improving effect of the drop property could be obtained. Specifically, it could be confirmed that, when the ratio of the amounts of Cu and Ni added was (10±3):1, the improving effect of the TCT property was obtained, while the good improving effect of the drop property could be obtained. In addition, it could be confirmed that, when the ratio of the amounts of Cu and Ni added was (5 to 20):1, and furthermore, when 0.8 to 1.2 mass % of Cu, 0.04 to 0.15 mass % of Ni, and 0.1 to 0.5 mass % of Bi were contained, the improving effect of the TCT property was obtained, while the good improving effect of the drop property could be obtained.

The invention claimed is:

1. A solder ball formed of a Sn—Bi type alloy containing Sn as a main element, 0.3 to 2.0 mass % of Cu, 0.01 to 0.2 mass % of Ni, and 0.3 to 3.0 mass % of Bi, wherein an intermetallic compound of $(Cu, Ni)_6Sn_5$ is formed in the Sn—Bi type alloy.

2. The solder ball according to claim 1, wherein the Sn—Bi type alloy contains Ag, and a content of the Ag is 1.0 mass % or less.

3. The solder ball according to claim 1, wherein a ratio of the Cu to the Ni is (5 to 20):1.

4. The solder ball according to claim 1, containing any one or two or more of Mg, Ga, and P in an amount of 0.0001 to 0.005 mass % in total.

5. The solder ball according to claim 1, wherein even if at least one of Ge, Sb, In, P, As, Al, or Au is contained, any one is contained as an inevitable impurity.

6. The solder ball according to claim 1, wherein the Sn comprises low α-ray Sn, and an amount of α-ray emitted is 1 [cph/cm$^2$] or less.

7. An electronic member comprising a plurality of electronic components jointed by a joint, wherein a part or all of the joint is formed by the solder ball according to claim 1.

8. The solder ball according to claim 2, wherein a ratio of the Cu to the Ni is (5 to 20):1.

9. The solder ball according to claim 2, containing any one or two or more of Mg, Ga, and P in an amount of 0.0001 to 0.005 mass % in total.

10. The solder ball according to claim 2, wherein even if at least one of Ge, Sb, In, P, As, Al, and Au is contained, any one is contained as an inevitable impurity.

11. The solder ball according to claim 2, wherein the Sn comprises low α-ray Sn, and an amount of α-ray emitted is 1 [cph/cm$^2$] or less.

12. An electronic member comprising a plurality of electronic components jointed by a joint, wherein a part or all of the joint is formed by the solder ball according to claim 2.

* * * * *